United States Patent [19]

Simko

[11] Patent Number: 4,520,461
[45] Date of Patent: May 28, 1985

[54] INTEGRATED HIGH VOLTAGE DISTRIBUTION AND CONTROL SYSTEMS

[75] Inventor: Richard T. Simko, Los Altos, Calif.

[73] Assignee: Xicor, Inc., Milpitas, Calif.

[21] Appl. No.: 367,264

[22] Filed: Apr. 12, 1982

Related U.S. Application Data

[63] Continuation-in-part of Ser. No. 230,683, Feb. 2, 1981, , which is a continuation-in-part of Ser. No. 6,026, Jan. 24, 1979, Pat. No. 4,314,265, and a continuation-in-part of Ser. No. 6,030, Jan. 24, 1979, Pat. No. 4,274,012.

[51] Int. Cl.³ ............................................. G11C 11/40
[52] U.S. Cl. .................................... 365/184; 365/203; 365/227
[58] Field of Search ............... 365/184, 185, 203, 226, 365/227

[56] References Cited

U.S. PATENT DOCUMENTS

| | | |
|---|---|---|
| 4,160,291 | 7/1979 | Smith et al. .......................... 365/203 |
| 4,263,664 | 4/1981 | Owen et al. . |
| 4,274,012 | 6/1981 | Simko . |
| 4,300,212 | 11/1981 | Simko . |
| 4,314,265 | 2/1982 | Simko . |
| 4,326,134 | 4/1982 | Owen et al. . |
| 4,360,902 | 11/1982 | Proebsting .......................... 365/203 |
| 4,377,857 | 3/1983 | Tickle ................................. 365/185 |

OTHER PUBLICATIONS

Tien, "Bit Line Selection Circuit for Programming Level Voltages in an Electrically Alterable Read-Only Storage", IBM Tech. Disc. Bul., vol. 23, No. 10, 3/81, pp. 4574-4576.

Primary Examiner—Terrell W. Fears
Attorney, Agent, or Firm—Fitch, Even, Tabin & Flannery

[57] ABSTRACT

Low power consumption methods and apparatus for distributing and controlling on-chip generated high voltage, for programming nonvolatile memory arrays and the like.

12 Claims, 11 Drawing Figures

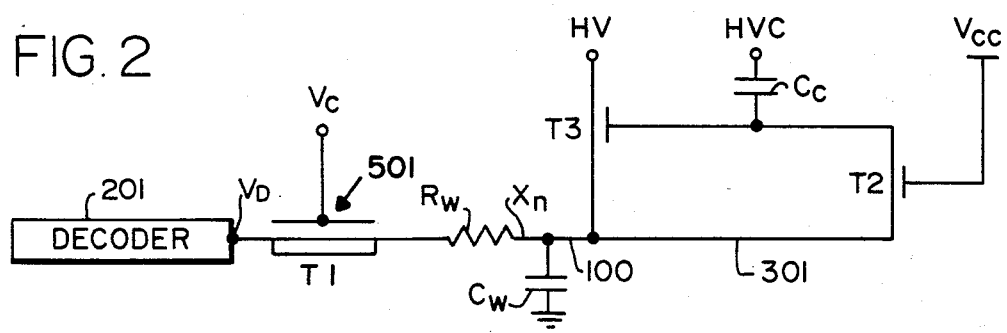
FIG. 2
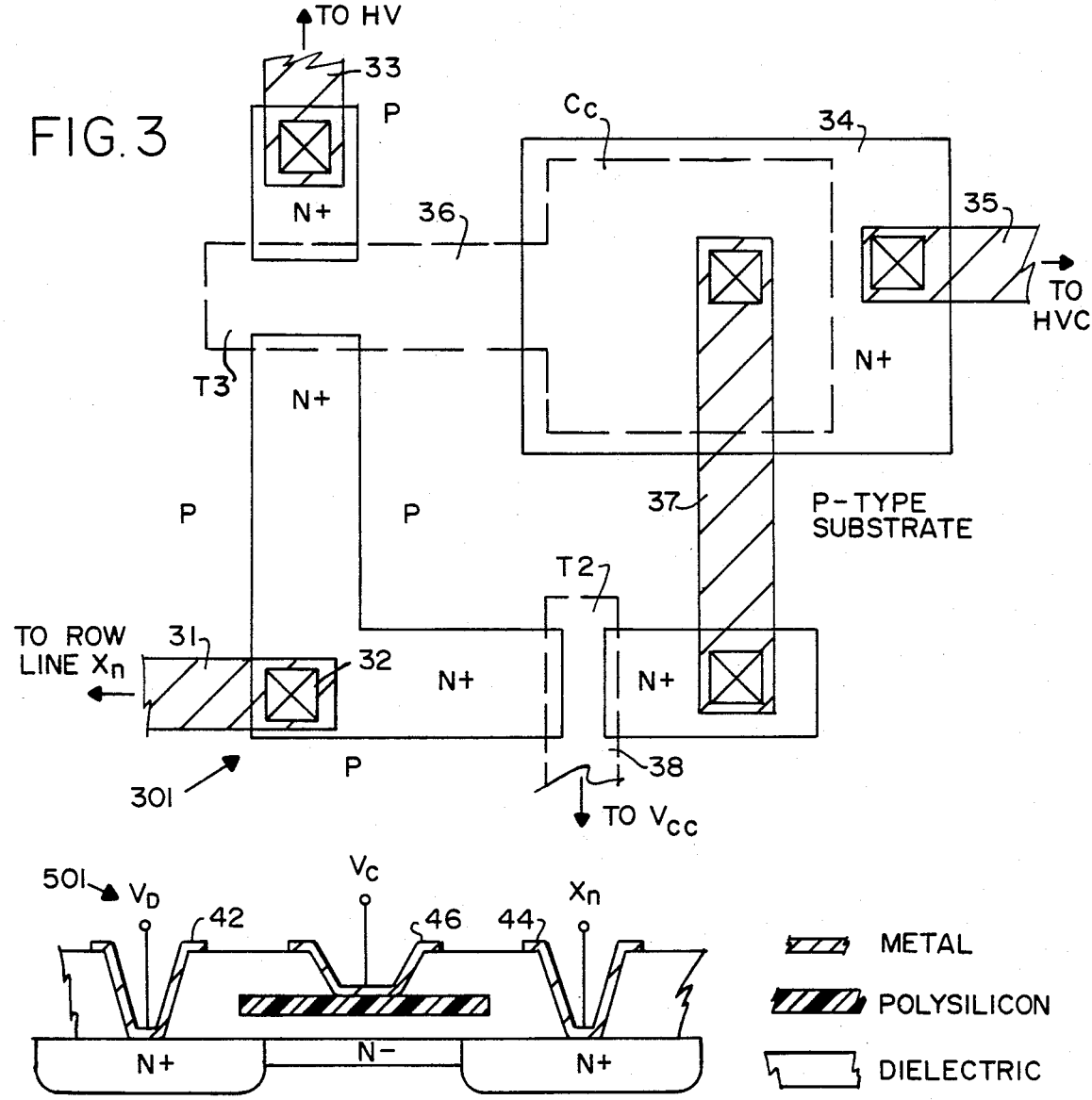
FIG. 3
FIG. 4

FIG. 8A READ MODE – UNSELECTED ROW
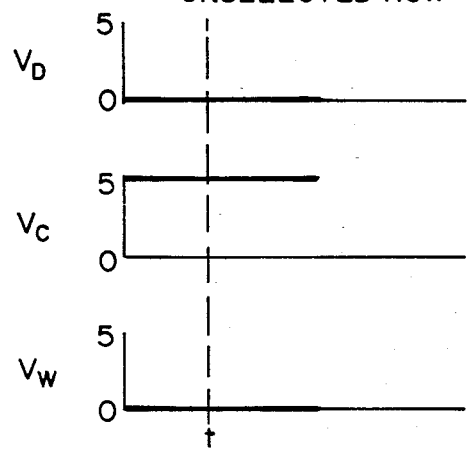
FIG. 8B READ MODE – SELECTED ROW
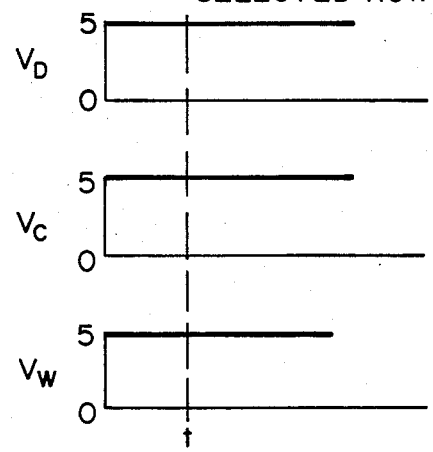
FIG. 8C HIGH VOLTAGE MODE – UNSELECTED ROW
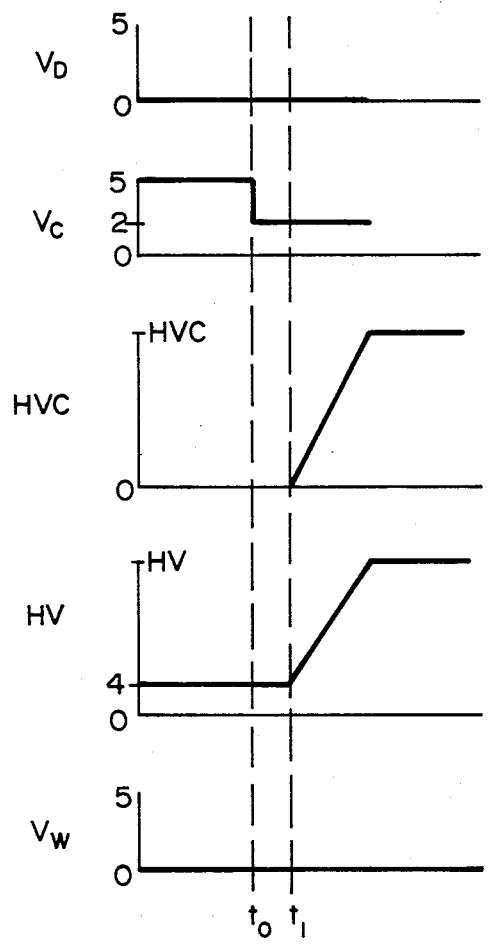
FIG. 8D HIGH VOLTAGE MODE – SELECTED ROW
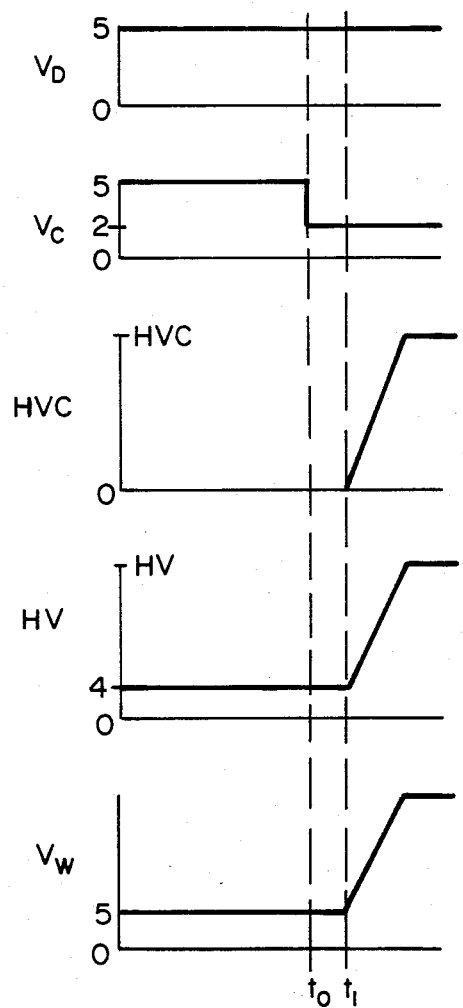

INTEGRATED HIGH VOLTAGE DISTRIBUTION AND CONTROL SYSTEMS

This application is a continuation-in-part of application Ser. No. 230,683 filed Feb. 2, 1981, which was a continuation-in-part of application Ser. Nos. 6,026 and 6,030 both filed Jan. 24, 1979, now U.S. Pat. Nos. 4,314,265 issued Feb. 2, 1982 and 4,274,012 issued June 16, 1981, which are incorporated by reference herein.

The present invention relates generally to the field of integrated circuit high voltage distribution and control circuitry and integrated circuit systems such as programmable nonvolatile memory and logic systems which utilize relatively high voltage signals in their operation. Methods and circuitry in accordance with the present invention find particular utility in providing integrated circuits such as electrically alterable nonvolatile programmable read only memory systems (EEPROM's) incorporating integrated floating gate circuit memory elements, wherein a relatively high voltage utilized for electrically altering the memory elements may be derived "on chip" (i.e., internally of the integrated circuit), rather than from an external high voltage signal source.

EEPROM memory circuits generally may be read using a relatively low voltage logic level potential, commonly 5 volts. However, various nonvolatile memory devices using floating gate technology utilize a relatively higher voltage, e.g., 20-25 volts, for writing or erasing the memory elements. Such higher voltages have conventionally been generated "off chip" (i.e., externally of the integrated circuit) due to the high current needs of decoder circuits on chip used to route the high voltage pulse to the memory cell or byte to be thus programmed.

Devices incorporating MOS floating gate elements are conventionally used for systems where electrically alterable prolonged data retention is required. A floating gate is an island of conducting material, electrically insulated from the substrate but capacitively coupled to the substrate, forming the gate of a MOS transistor. Depending on the presence or absence of charge on this floating gate, the MOS transistor will be rendered conductive ("on") or nonconductive ("off"), thus forming the basis for memory device storage of binary "1" or "0" data corresponding to the presence or absence of floating gate charge. Various means of introducing and removing the signal charge from the floating gate are known. Once the charge is on the gate, it remains substantially permanently trapped, because the floating gate is completely surrounded by an insulating material which acts as a barrier to the discharging of the floating gate. Charge can be introduced onto the floating gate using hot electron injection and/or tunneling mechanisms. Charge can be removed from the floating gate by exposure to radiation (uv light, x-rays), avalanche injection, or by tunneling.

Improved nonvolatile memory elements and arrays such as described in U.S. Pat. Nos. 4,274,012, 4,300,212 and 4,314,265 have been provided which utilize relatively high voltages for programming and erasing of integrated circuit nonvolatile memory elements, and such systems have included on-chip generation of the high programming and erasing voltages, as described in U.S. Pat. No. 4,263,664 and U.S. patent application Ser. No. 71,498 filed Aug. 31, 1979 and entitled "Integrated Rise-Time Regulated Voltage Generator Systems".

However, a critical problem in the provision of integrated memory circuitry which generates high programming voltages on chip from external logic level power supplies, has been that the amount of current needed to conventionally decode high voltage in the EEPROM is substantially in excess of the amount of current available from on-chip high voltage generators. For example, there may be 128 or 256 or more decoders required, one for each row line in the on-chip memory array. Conventional static or ratioed logic used in such decoders utilize load resistors or transistors which constantly draw DC current. A circuit containing 128 such decoders would, for example, need current in the milliamp range to selectively keep "off" 127 such decoders during a write operation. Larger memory arrays would require still more current. However, on-chip high voltage generators typically have very limited current capacity. For example, a typical on-chip charge pump may provide an output current in the range of about 10 microamperes, which is entirely inadequate to meet the current requirements of common memory addressing circuitry.

Because of this relatively low on-chip high voltage current capability, it would be desirable to be able to distribute the high voltage generator output in a controllable manner which does not overload the limited capabilities of such generators. Accordingly, there is a need for integrated circuit systems for controlling and distributing high voltage, which does not require substantial current loading from individual decoder circuits of a memory array. Such systems would be particularly desirable in respect to nonvolatile integrated circuit memory systems of substantial size, such as 16K or more bit memory systems which have 128 or more decoder circuits for addressing the memory array.

In addition, high voltage power distribution and control systems should desirably contain a minimum of components and thus be capable of occupying only a small layout area. This is important because many such circuit subunits may be utilized in providing high voltage distribution to selected circuit elements. To minimize chip size, such circuits should also desirably be capable of fitting into a narrow width or "pitch' of the row and/or column line of a nonvolatile memory array.

Moreover, it is desirable that such integrated circuit high voltage control circuits, which would tend to have high impedance and low current capability, be compatible with fast logic level integrated circuit components, such as memory word line decoder circuits, which have the opposite characteristics of low voltage, low impedance and high current carrying capabilities.

Accordingly, it is an object of the present invention to provide improved integrated circuit methods and apparatus for controlling and applying high voltages. It is a further object to provide nonvolatile electrically erasable and programmable read only memory devices adapted to generate on-chip and selectively apply high voltage programming signals having limited current capacity to addressable memory cells. These and other objects of the invention will become apparent from the following detailed description and the accompanying drawings, of which FIG. 1 is a schematic block diagram of an embodiment of a nonvolatile electrically-alterable random access memory array incorporating various aspects of the present invention;

FIG. 2 is a circuit diagram of an embodiment of decodable high voltage control and distribution circuitry which may be used in the array of FIG. 1;

FIG. 3 is a top view of an integrated circuit embodiment of the high voltage control and distribution circuit of FIG. 2;

FIG. 4 is a cross sectional side view of the coupling-/decoupling transistor of the embodiment of FIG. 2;

FIGS. 8a–8d are diagrams illustrating the operational states of the circuit of FIG. 2.

Figure 1:
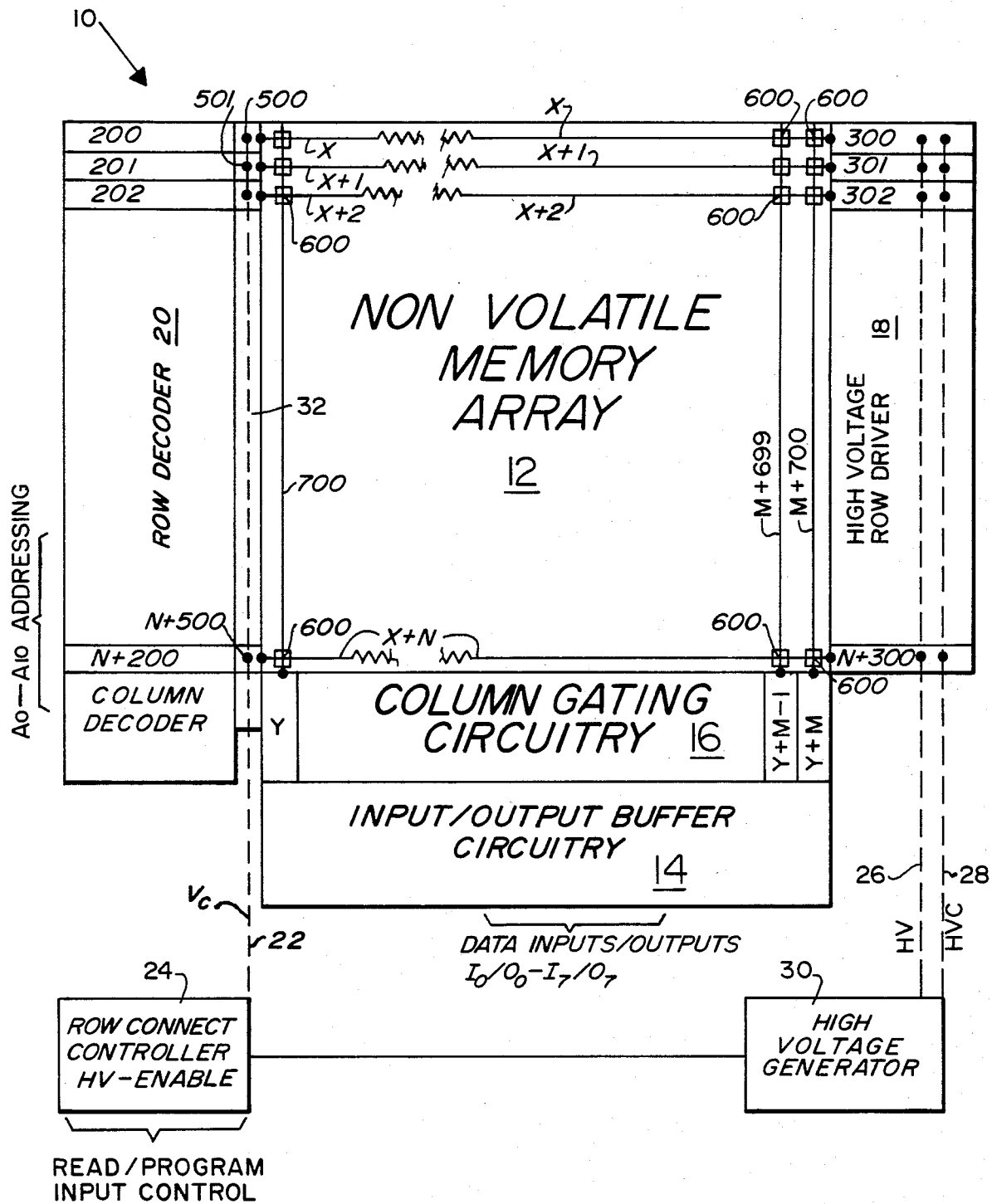

Generally in accordance with the present invention, methods and integrated circuits are provided for selectively applying high voltage potentials to circuit elements utilizing such potentials, such as nonvolatile memory elements in a nonvolatile memory array. Such circuit systems may comprise decoding means for charging a selected one or more circuit element nodes of a plurality of such nodes to a first electrical potential and for charging other nodes of the plurality of nodes to a second potential, coupling/decoupling means for electrically isolating at least the selected one or more circuit element nodes which have been charged to the first potential, and selective high voltage charging means for selectively charging the one or more electrically isolated output nodes at the first potential to a high potential greater than the first potential, while preventing the charging of other nodes to a high potential. The methods and integrated circuit systems are particularly useful in the control and distribution of relatively high potentials in the range of from about 10 volts to about 50 volts generated by integrated circuit, on-chip high voltage generators having a limited current output capability in the range of from about 0.1 to about 100 microamperes, which may be selectively and addressably transmitted to one of a plurality of possible destinations. In accordance with the invention, a relatively high potential may be applied to a selected one or more of a plurality of, for example, at least about 128 destinations, e.g., to one of 256 bytes of eight memory cell bits each.

In accordance with aspects of various of the integrated circuit element embodiments of the present invention, distribution and control circuits may be provided for selectively applying a high potential to an output node, comprising means for receiving a high voltage signal having a maximum potential of at least about 10 volts and preferably in the range of from about 15 to 40 volts, means for sensing the potential of the output node, and means responsive to the sensed potential of the output node for applying a high potential of at least about 10 volts and preferably in the range of from about 15 to 40 volts to the output node when the sensed potential of the node is above a predetermined value, and for preventing the application of a high potential to the output node when the sensed potential of the output node is below a predetermined value. Desirably, the output node will be in a substantially floating electrical condition, and the means responsive to the sensed potential of the output node may transmit high voltage between the output node and the high voltage receiving means when the sensed potential is above a predetermined value, and for substantially completely preventing transmission of high voltage between said high voltage receiving means and said output node when the sensed potential of the output node is below a predetermined value. Such distribution and control circuits require substantially no current, e.g., less than a few nanoamperes, to operate. Desirably, the predetermined sensed potential values may be based on (i.e., correspond or be intermediate to) logic level potentials in a memory array or other circuit logic, and the output nodes may be electrically isolatable word or column lines of the memory array. In this regard, it is particularly advantageous that the output node of the distribution and control circuit may be a row or word line of a nonvolatile memory array which may be charged to a control potential and electrically isolated at the control potential by appropriate decoding and decoupling circuitry. In this regard, in accordance with additional aspects of the present invention, integrated circuit elements are provided for controlling the electrical connection of a node such as a word line of a nonvolatile memory array, with row decoder circuitry for selectively decoding input address signals and applying a logic level output potential to a selectively addressed output node of the decoder circuitry. Means are provided for applying a predetermined logic level potential to an addressed output node such as a word line of a memory array, and subsequently electrically isolating the node from the decoder circuitry, the logic level potential applied to the node prior to electrical isolation may be a potential above the potential recognized by the high voltage control circuitry as a condition for applying high voltage potential to the output node. The circuit control element may maintain electrical connection of the decoder circuitry with non-selected nodes to maintain the non-selected nodes at a potential recognized by the high voltage distribution and control circuitry as a condition for preventing application of high voltage to the node.

It will be appreciated, particularly in view of the following detailed description, that the high voltage distribution and control circuitry may be combined with conventional row or word line circuitry, and may include means for selectively isolating the word lines to provide a compact and effective system with low current consumption for addressably applying high potentials to a nonvolatile memory array.

Generally in accordance with method aspects of the present invention, methods are provided for selectively applying high potentials in integrated circuit systems such as nonvolatile memory arrays and the like, comprising the steps of addressing and charging one or more selected output nodes such as word lines of a memory array to a predetermined first control potential and charging other nodes to a predetermined second potential. The term charging is used in a general sense to include providing the desired potentials to the respective nodes, which may involve an increase in potential, a decrease in potential or a maintenance of potentials, depending on the respective potentials of the nodes at the time of the charging step. In accordance with preferred embodiments of such methods, the first and second control potentials may correspond to logic level potentials which may be selectively applied to memory array word lines by conventional decoder circuitry.

Such methods further contemplate electrically isolating at least the selected one or more nodes. The other unselected nodes may be similarly electrically isolated or may be continuously maintained at the second logic level potential by connection with an appropriate potential source such as memory decoder circuitry. The method further contemplates charging the one or more electrically isolated nodes at the first control potential to a high potential. This may be carried out by sensing the potentials of the nodes and applying a high potential to the electrically isolated nodes at a first logic level potential, while substantially completely preventing application of high potential to nodes maintained at a second logic level potential. In this manner, substantial current drain to high voltage sources may be prevented.

Having generally described various aspects of the present invention, it will now be more particularly described with respect to the nonvolatile memory system 10 illustrated and described in FIGS. 1-8.

Schematically illustrated in FIG. 1 is an embodiment 10 of a nonvolatile electrically alterable read only memory system incorporating addressable, low power consumption, distribution and control circuitry for selectively applying an on-chip generated high voltage power supply to one or more selected nonvolatile electrically alterable memory cells in the array. As illustrated in FIG. 1, the nonvolatile memory array 10 comprises a centrally located array 12 of nonvolatile read only memory elements 600, which may be of the type described in the above-incorporated copending patent application Ser. No. 230,683.

While the memory cells 600 utilize the floating gate configuration of the Ser. No. 230,683 patent application, it will be appreciated that various types of nonvolatile memory cells and arrays including EEPROM arrays and programmable logic arrays which electrically store and erase charge may be used, and that the present invention will find wide utility therewith. In memory array 12, the individual nonvolatile memory cells 600 are in an N by M array addressed by a plurality of N "row" or "word" lines X through X+N and arranged in M addressable column lines symbolically represented on FIG. 1 as column lines Y through Y+M in accordance with conventional practice. The numbers N and M of word and column lines may vary, depending upon the size of the array 12, and correspondingly, with the number of memory cells 600 which may be stored and addressed in the array 12. In a typical 8K memory array, 128 word lines and 64 column lines may be provided, while in a 32K memory array, the respective number of lines would be doubled. Multiple arrays 12 may be fabricated on a single integrated circuit chip, to provide increased memory capability from a particular memory design.

Also, generally in accordance with conventional practice, the row lines X through X+N are addressed by a row decoder 20 which comprises a plurality of decoder segment circuits 200 through 200+N, each corresponding to a respective row line. In the illustrated embodiment 10, the respective decoder segment circuits which may be provided in accordance with conventional practice, make electrical connection to the respective row lines through a coupler/decoupler array 32 comprising a corresponding plurality of coupling-/decoupling transistors 500 through 500+N, as will be more fully explained hereinafter. The coupling/decoupling transistors are controlled by a control potential Vc applied to a control line 22 from a row connect and high voltage generator enable control circuit 24, the operation of which will also be more fully described hereinafter.

The column lines of the illustrated embodiment are similarly provided with input/output (I/O) buffer circuitry 14 and column decoder gating circuitry 16, which comprises a plurality of column circuits 400 through 400+M for decoding column lines Y through Y+M, respectively. The column I/O buffer circuitry and column decoder gating circuitry may be provided in accordance with conventional practice, and need not be further described. The column circuits and the column lines may be provided and utilized for addressing the elements 600 of the array 12 in a conventional manner, and are not directly related to the function of the high voltage word driving circuits 14. In this regard, the illustrated memory device 10 is also provided with 5 volt power supply, I/O pins and address pins as indicated.

The illustrated nonvolatile memory embodiment 10 is further provided with a high voltage word or row driver circuitry 18 comprising a plurality of N high voltage driver circuits 300 through N+300, each corresponding to and making an electrical connection with respective row lines X through X+N. As shown in FIG. 1, the high voltage driver circuits apply a high voltage source signal HV from an on-chip high voltage generator 30 to one or more selected row lines X through X+N as will be more fully described hereinafter.

Each of the high voltage driver circuits of the high voltage word driver circuitry 18 receives a high voltage source signal HV and a high voltage control signal HVC, by means of respective lines 26, 28 from a suitable high voltage source generator 30. The high voltage source generator 30 which provides the indicated high voltage signals HV 26 and HVC 28 may be an integrated circuit charge pump or voltage multiplier of appropriate design, such as that illustrated in U.S. Pat. No. 4,263,664, and U.S. patent application Ser. No. 71,498 filed Aug. 31, 1979, which are incorporated by reference herein, although other generator designs may be utilized. Desirably the generator 30, when activated, provides a relatively slowly rising output signal HV which is selected to be suitable for programming of the particular type of memory cell utilized in the array 12. It is noted that the HV signal 28 of the generator 30 may typically have a potential in the range of 15-45 volts, depending on the program and erase requirements of the cells 600, and may typically have a current output capacity in the range of 5-15 microamperes. The HVC signal is a control signal having a potential slightly above that of the HV signal, which HVC signal is not intended to be subjected to substantial current utilization.

In the illustrated embodiment 10, the output nodes of the row decoder circuits 200 through 200+N are each connected to one end of their respective row lines X through X+N, by means of respective coupling/decoupling transistors 500 through 500+N. The row lines, which are otherwise substantially completely isolated by a suitable dielectric such as silicon dioxide, are connected at their respective opposite ends to the individual high voltage driver circuits of the driver bank 18. By means of the coupling/decoupling circuitry 32, the row lines may be electrically isolated in a "floating" condition, and the row line capacitance may be used to store dynamically a "Hi" or "Lo" decoded state as a stored potential (nominally a logic level potential such as 0 or 5 volts) on a selected row line capacitance after the row decoder 20 has been decoupled from the row line by the respective coupling/decoupling transistor 32. By this means, the distribution and control circuit 18 is given information which it utilizes to determine whether or not to apply a high voltage such as the HV signal to that respective row line. At the same time, the distribution and control circuitry 18 is decoupled from the low impedance row decoder 20 by the coupling/decoupling array 32, so that the low power, high voltage distribution and control circuitry 18 does not contend with the relatively high power, low impedance row decoder circuitry 20.

While the column gating and I/O circuitry and row decoder circuitry may be provided in accordance with conventional technology and accordingly need not be further described, the coupler/decoupler array 32 and high voltage row driver circuitry 18 are novel components which will be further described with respect to the embodiment of FIG. 2, which illustrates an individual coupling/decoupling transistor 501 of the decoupling array 22, an individual row line Xn of the memory array 12, and individual high voltage distribution and control circuit 301 of the high voltage row driver 18 of the embodiment 10 of FIG. 1. The illustrated embodiment 10 may advantageously utilize 5 volts n-channel MOS technology, but it will be appreciated that other processes and logic level parameters may also be utilized. Various of the components of FIG. 2 are further illustrated in FIGS. 3 through 7.

The illustrated distribution and control circuitry of FIGS. 1–7 is extremely low power (substantially zero), dynamically decodable, low in component count, and utilizes a small layout area. The circuitry will first be described with respect to the schematic illustration of FIG. 2, and then the respective components will be further described with respect to FIGS. 3–7.

As illustrated in FIG. 2, the distribution and control circuit 201 is coupled to one end of row line Xn of the memory array 12. In the illustrated embodiment of FIG. 2, the word or row line Xn is represented by an effective resistance Rw which will be a function of line length, cross section and material of construction, and a capacitance Cw, which is principally developed between the word line and the monocrystalline semiconductor substrate. The effective resistance of the word line, which may be fabricated from polycrystalline silicon or other suitable conductive material, may typically be in the range of from about 5–50,000 ohms, for example, about 5,000 ohms. The effective capacitance of the word line, which will include the capacitance of the individual memory cells connected thereto as well as associated with the word line itself, may typically be in the range of from about 1 to about 10 picofarads.

The high voltage row driver segment 301 comprises a node HV for receiving the high voltage signal from line 26 of generator 30, and a transistor T3 for regulating conduction between the row line Xn and the HV node, under control of transistor T2, capacitor C and node HVC to which is applied the HVC control signal from line 28 of generator 30. The other end of the row line Xn is coupled to coupling/decoupling transistor 501, which is a depletion type MOS transistor T1 having a threshold Vt in the range of from about $-1$ to $-2$ volts, which in turn connects to output node Vd of conventional NOR decoder segment 201. The coupling/decoupling transistor 501 will typically have a resistance in its conducting "on" state of about 8000 ohms or less, and preferably 5000 ohms or less, and in its fully nonconducting "off" state will desirably have a resistance of a billion ohms or more, at ambient temperature (e.g., 25 C.). The decoder output node Vd will have a nominal logic level potential (e.g., 0 or 5 volts), depending on whether or not the row line is addressed by the decoder 201.

The potential Vc supplied to the gate of the coupling/decoupling transistor 501 (shown as node Vc) depends on and determines whether a read or high voltage mode of operation of the device is selected. The signal Vc for controlling the coupling or decoupling of the row line Xn from the decoder 201 is provided by an appropriate line from the controller 24 to each of the coupling/decoupling transistors T1 of the respective circuits 500 through N+500 of the circuit 22.

The control voltage Vc for the gate of depletion transistor T1 will have a logic level "Hi" potential of about 5 volts, and a "Lo" potential in the range of 0–2 volts, depending on whether the row line Xn is to be connected to or disconnected from the decoder 201. When the EEPROM 10 is being utilized in the ROM read mode, the row line Xn will be in electrical connection with the decoder 201 by means of the transistor T1 being rendered conductive with a 5 volt gate potential Vc being applied thereto. When the EEPROM 10 is being programmed, the line Xn may be effectively disconnected from a 5 volt decode potential VD by means of application of a low 0–2 volt potential Vc to the gate of depletion transistor T1. While illustrated transistor T1 is a depletion MOS transistor, it could be fabricated as an enhancement type, but this is less desirable because the control voltage Vc could then be about $+7$ volts or more in the read mode in which the row line Xn is coupled to decoder node VD, and below 5 in the high voltage mode, in which the row line is decoupled from node VD. Upon completion of a programming cycle, the generator 30 may be turned off and control potential Vc may be returned to a 5 volt potential to again connect the word lines to the decoder.

In the programming mode of operation of the device 10, a high voltage is applied to one or more selected row lines by means of the distribution and control circuits 300 through 300+N. As indicated, the control and distribution circuit 301, like the others, comprises a transistor T3 which regulates the transmission of high voltage signal HV to the row line Xn. The gate potential of transistor T3 is regulated by the interaction of transistor T2, which "senses" the potential of the row line, and Capacitor C which couples the gate of transistor T3 to high voltage control signal HVC. The function of capacitor C is to couple the high voltage HVC to the gate of transistor T3, while transistor T2 couples or decouples the source and gate of transistor T2, while transistor T3 couples or decouples the high voltage HV to the row line Xn.

In the illustrated embodiment, a potential Vcc, which is the power supply voltage common to the row decoder and all other basic circuits in the integrated circuit device 10 (Vcc is typically 5 volts $\pm 10\%$) is applied to the gate of transistor T2.

In the illustrated embodiment, the word line resistance Rw may range from substantially 0 to $10^7$ ohms, and the row line capacitance Cw may range from 0.1 picofarads to 100 picofarads, depending on the size, dielectric and conductor materials, etc. used. The transistor T2 and T3 may typically have Z/L ratios of 2/10 to 10/5 (dimensions in microns), which permit the driver segment 301 to readily fit along a memory pitch width of the array 12.

In this regard, the illustrated coupling/decoupling transistor 501 and distribution and control circuit 301 may be laid out in a small pitch or a width consistent with the pitch of a nonvolatile memory cell array, which refers to the distance from one line to the next line in the memory array. The row pitch may conventionally be in the range of from, say, about 10 to about 30 microns for characterizing a fairly dense contemporary memory, using 3 to 5 micron design width rules. The design width rules may be reduced to provide increased density.

Having generally described the circuit of FIG. 2, various of the components will now be further descibed with reference to FIGS. 3–7. Illustrated in FIG. 3 is a top view of an integrated circuit layout for a high voltage distribution and control circuit 301 of FIG. 2 in which various layers of the device are shown in overlying relationship. The device components, like the other integrated components of the EEPROM 10 may be fabricated on a p-type monocrystalline silicon substrate in accordance with known fabrication techniques. In the illustraged device, N+ doped regions 32 in the substrate form the source/drain regions for enhancement transistors T2 and T3. The transistors T2, T3 make electrical connection as indicated on FIG. 3 with an overlying metal (e.g., aluminum) lines 31, 33, 35, 37 connecting respectively to the row line Xn, HV signal line 26, HVC signal line 28, and capacitor Cc. The capacitor Cc is in turn formed by an N+ implant zone 34 as one plate, making electrical contact with the HVC signal input via conductor 35, and a dielectrically isolated polysilicon electrode 36 intermediate the metallic connecting line 37 and the implant zone 34. An extension of the upper polysilicon capacitor plate 36 forms the gate of transistor T3. The gate of transistor T2 is similarly formed by a polysilicon line 38 (overlying the thin implant oxide of the N+ implant zone 32), which makes electrical connection to the 5 volt power supply Vcc.

A conventional n-channel depletion transistor 501 is shown in cross section in FIG. 4, in which electrodes 42, 44 contacting N+ regions are connected to the decoder output VD and word line Xn respectively, and gate 46 separated by appropriate dielectric layer from the underlying n-type zone controls the conductivity of the device 501.

Figure 5:
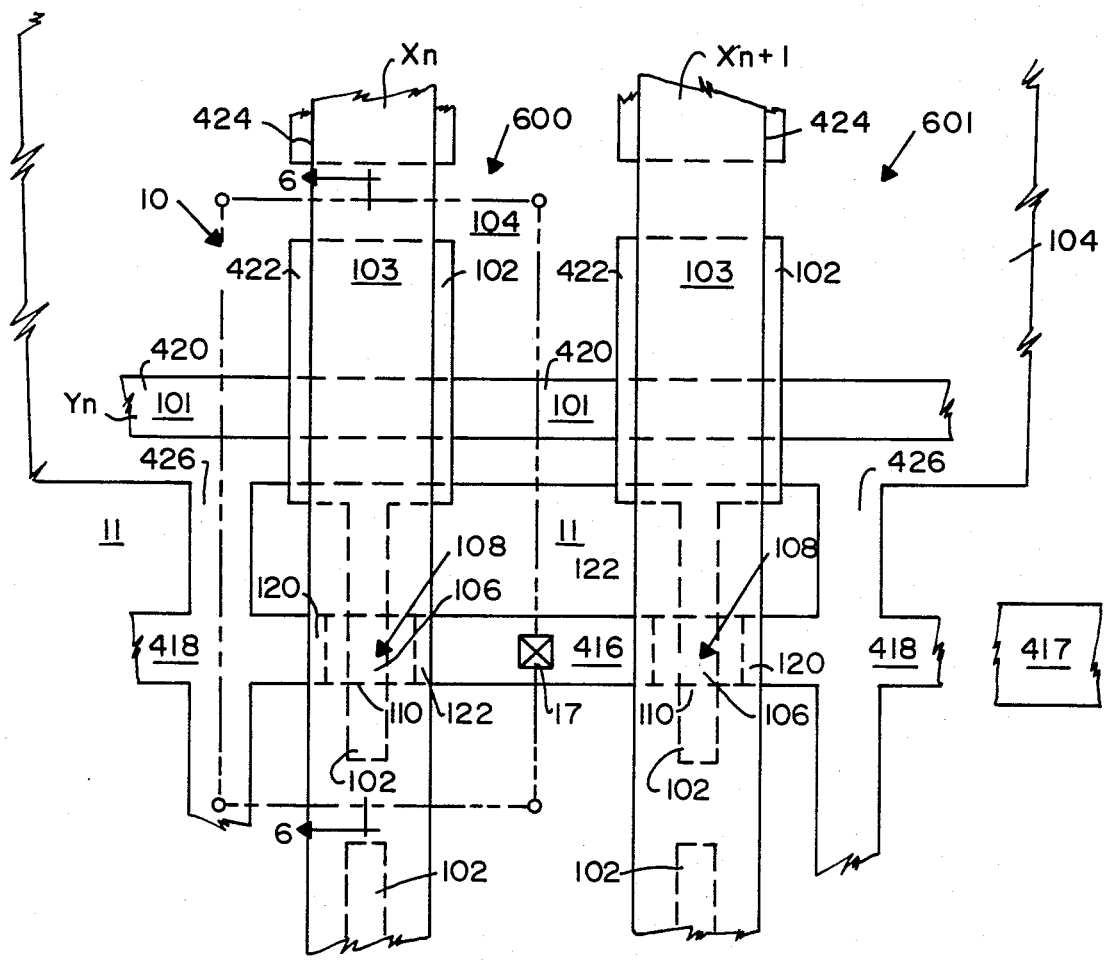
FIG. 5 is a top view of an embodiment of electrically alterable memory circuitry which may be used in the electrically alterable memory array of FIGS. 1 and 2.
Figure 6:
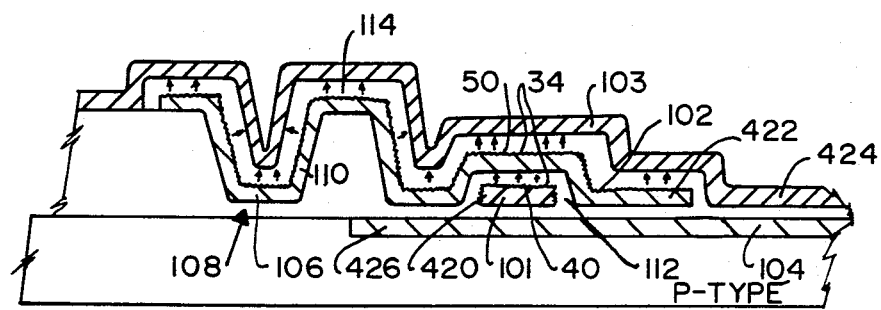
FIG. 6 is a cross sectional side view of the integrated memory circuitry of FIG. 5 taken through line 6—6.
Figure 7:
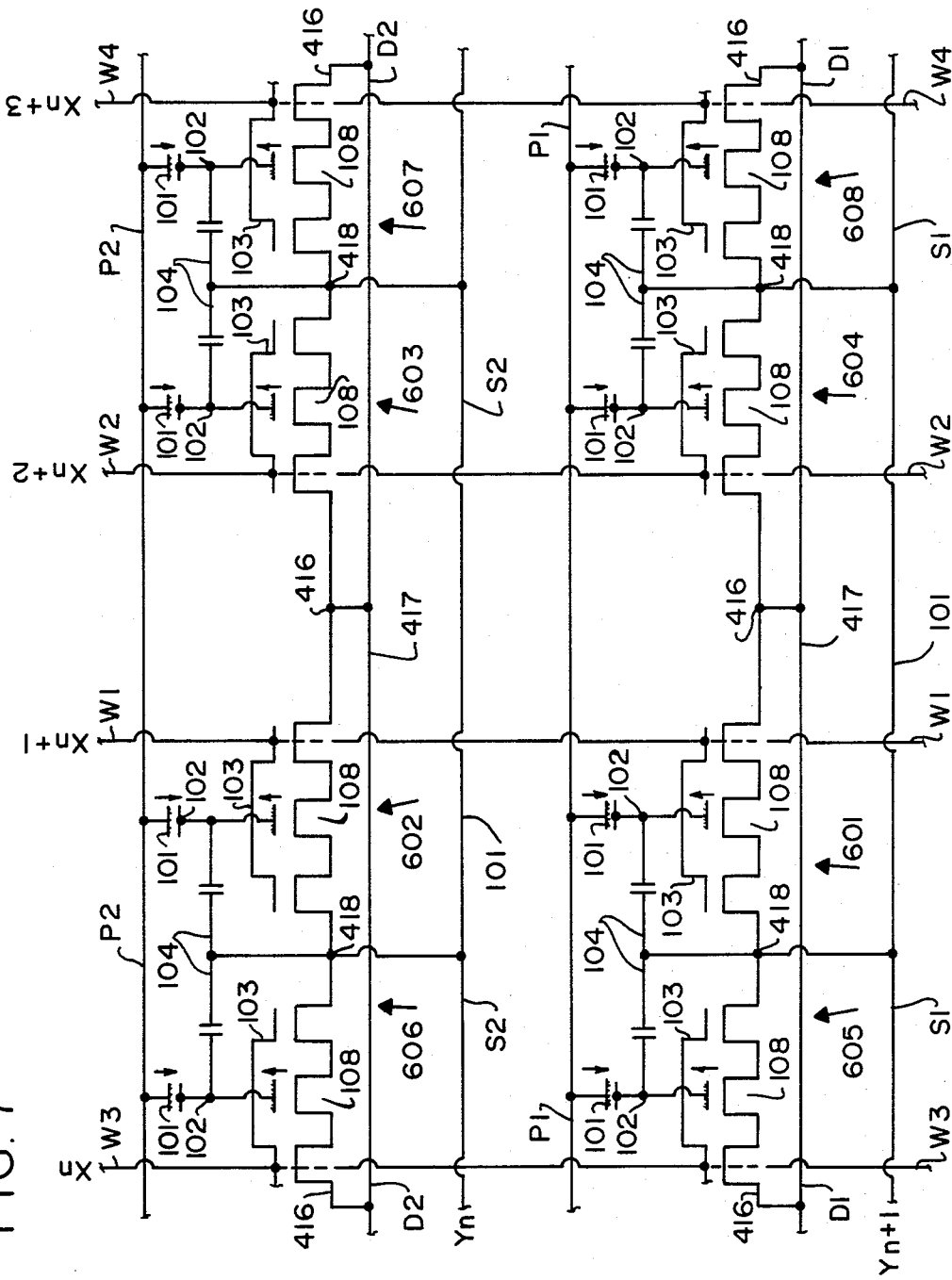
FIG. 7 is a schematic diagram of an array of memory cell devices like that of FIG. 5.

An exemplary nonvolatile memory array according to one preferred embodiment, wherein the word lines may be spacially intermediate the coupling/decoupling transistor 501 of FIG. 4 and the high voltage circuit 501 of FIG. 3, may be fabricated using a substantially monocrystalline p-type silicon semiconductor substrate, and three subsequently sequentially deposited, patterned, etched and insulated conductive layers 420, 422 and 424, as shown in FIGS. 5–7. It should be noted that word lines Xn, which are representative of word line X through X+N, are shown in vertical disposition in FIGS. 5–7 while column lines are shown in horizontal disposition. Zones 426 of opposite conductivity type from the substrate are introduced into the monocrystalline substrate and isolated from the substrate by reverse junction action. A dielectric layer insulates the N-type zones 426 from the polysilicon layers, which respectively form a programming electrode 101, and overlying floating gate 102, and a word select/erase electrode 103 overlying the floating gate. An n-type zone 426 forms a bias electrode 104 in the substrate, which underlies a portion of the word select/erase electrode, programming electrode and floating gate. A part 106 of the floating gate 102 forms the gate of an MOS sense transistor 108 formed in sense transistor channel 110 for sensing the electric potential charge state of the floating gate 102.

A mirror-image symmetrical cell 601 is shown in FIG. 1 associated with the cell 600. These cells 600, 601 form a cell pair which may be repeated to form a memory array extending in both the X (up-down) and Y (left-right) directions. In such an array, the word select/erase electrode 103 extends to contiguous cells to form the ("row") word select lines of the array. Programming electrode 101 is repeated in the Y direction to contiguous cells to form the column programming lines of the array. The MOS sense transistors 108 of the two cells share a common drain 416 formed as an N-type diffusion or implant region in the p-substrate, which is connected to an overlying metal line 417 for a Y-select sensing of the cell as part of a memory array. The same type of N-type diffusion or implant region in the p-substrate forms common source lines for transistors 108 in the Y direction. The area between each respective souce and drain defines the channel region of the MOS sensing transistor. Although separate acess to individual bits in a memory array is one option, in the embodiment shown in FIG. 1, the cells are organized in byte groups of, for example, eight cells or "bits" each, with pairs of cells extending horizontally being part of such a byte. In operation of such memory cells, the substrate may be biased to about zero volts, the N-type channel may be biased to about zero volts, and programming and erase voltages of plus 25 to 40 volts may be applied selectively to the polycrystalline and n-type substrate electrodes. As indicated, X-Y decoding circuitry may be provided in accordance with conventional practice.

The polycrystalline silicon layers 420, 422 and 424 may be deposited, patterned, etched, oxidized, and the N-type substrate layer 426 diffused and implanted, in accordance with conventional practice. As best seen in FIG. 6, silicon dioxide dielectric layers 112, which in the illustrated embodiment are grown from the respective silicon substrate or polysilicon elements by conventional thermal oxidation techniques to an inter-element thickness of about 1000 Angstroms, dielectrically isolate the substrate and polysilicon layers from each other. The floating gate 102, programming electrodes 101 and word lines Xn (select/erase electrode 103) are formed of polysilicon layers suitably sequentially deposited, and etched and oxidized, or otherwise patterned and fabricated by conventional photolithographic techniques, to form the illustrated device structure, which is shown in FIGS. 5–7. The various elements are shown as if the dielectric layers 112 were transparent, so that the underlying electrode structure may be illustrated. Further detail of the device structure is shown in the cross-sectional views of FIG. 6.

The programming electrode 101 have associated asperities to form a diode-like structure with the adjacent smooth undersurface of the floating gate 102. Asperities provide the same diode-like characteristic between the floating gate and the word select/erase electrode 103.

A third polysilicon layer 424 is deposited (after etching and oxidation of the second floating gate layer) over the floating gate 102 and processed to form a word select/erase electrode 103, which in conjunction with the asperities on the top surface of the floating gate 102 and the biasing obtained from bias electrode 104 forms a means for removing electrons from the floating gate.

Bias electrode 104 is diffused or implanted in the p-type substrate, and functions to appropriately bias the floating gate 102 during the write, erase and read operations. Bias electrode 104 is common with the source lines 418, transistor 108, such that the source lines 418 may provide the biasing voltage for electrode 104.

By appropriately biasing the floating gate 102 to a positive polarity with respect to the programming electrode 101, electrons will tunnel from the programming electrode 101 to the floating gate 102. After the biasing voltage is removed from the floating gate 102, the tunneled electrons are confined on the floating gate, since they do not have the energy to surmount the energy barrier of the isolating oxide 112. The electrons may be retained substantially indefinitely on the floating gate unless removed, and provide a negative electric charge to the floating gate which is sufficient to turn off the floating gate MOS sense transistor 108.

Electrons may be removed from the floating gate by means of the word line 103, which is separated by a silicon dioxide dielectric layer 114 from, and positioned to overlap a portion of the surface of the floating gate 102 that includes asperities. By appropriately biasing the erase gate electrode 103 at a sufficiently high positive potential with respect to the floating gate, electrons may be caused to tunnel from the asperities on the upper surface of the floating gate to the erase electrode. In this manner the floating gate 102 may be provided with a relatively positive charge, which is sufficiently positive to turn on the N-channel MOS transistor 108.

A portion 106 of the floating gate 102, in a channel 110, forms the gate electrode of an MOS sense transistor 108 comprising source and drain regions 120, 122 which are respectively parts of the common source line 418 and drain line 16, and are of N+ conductivity type. These regions 120, 122 are separated by intermediate portions of the p-type substrate, which are respectively modulated by the voltage of the word line (select/erase gate 103) and the voltage of region 106 of the floating gate 102.

In operation of the mercury cell 600, the floating gate 102 is either charged with an excess number of electrons, which causes its voltage to be low (negative) and thereby functions to turn off the remotely located sense transistor 108, or the floating gate is charged relatively positive by a removal of electrons which causes its voltage to be high, thereby turning on the sense transistor 108. The on or off nature of the sense transistor 108 forms the basis for detecting the memory state of the floating gate 102 of the memory cells 600. This memory state of the floating gate 102 may be altered by introducing (or "programming") electrons into the gate, and by removing (or "erasing") electrons from the gate.

The programming electrode 101 forms a capacitor having a capacitance CP with the adjacent surface of the floating gate 102 and provides charge (electrons) to the floating gate when a sufficient voltage is developed across the capacitor. When the floating gate is charged negative, the field effect transistor 108 is "off". The floating gate 102 also forms a capacitor having a capacitance CW with the word line (select/erase electrode 103). When the floating gate 102 is charged positive as when electrons are tunneled from the floating gate 102 through erasing capacitor CW the field effect transistor 108 is "on". The erase electrode 103 provides a charge sink for charge removal from the floating gate 102 when the voltage across capacitor CW is large enough to tunnel electrons from the floating gate 102.

The bias electrode 104 which is formed in the substrate, and comprises layer 426, forms a relatively large capacitor, having a capacitance CS, with the floating gate. During programming the electrical potential of the bias electrode is made "high" (e.g., 26 volts), preferably by raising the voltage on the source line 418. During erasing, the potential of the bias electrode 104 is made "low" (e.g., about zero volts).

As more described in parent application Ser. No. 230,683, suitable capacitance relationships should be maintained to ensure that strong enough fields occur in capacitors CP, CW and CS for programming, reading and erasing of the floating gate.

Cell 600 may be operated in a dense array of compact cells. FIG. 5 illustrates two cells 600, 601 sharing a common sense transistor drain contact, which may form a repeating unit in a large, integrated circuit array of memory cells 12. The unit cell dimensions of the illustrated cell pair may be about 20 microns (Y direction) and 30 microns (X direction) for 4 micron design rules. In connection with discussion of such operation in a cell array, a symbolic representation of individual memory cells 600, 601, 602, 603, 604 is depicted in FIG. 7 in which source and drain lines are shared with mirror image cells 605, 606, 607, 608 to improve density. The polysilicon word lines (select/erase electrode 103) continue from cell to cell across the array 12, for cell selection purposes, to serve as a word select gates Xn, Xn+1, etc. In this illustration, a number of cells are shown in a memory array configuration which is continued in the N by M array 12. Each cell can be written, erased and read in the array 12 without disturbing the immediately and diagonally adjacent or mirror image cells.

Typical operational voltages impressed on the array of FIG. 7 for the elements of the array, to perform the various described memory functions, may be as follows:

| | ARRAY OPERATION | | | | | | | | | | | | | | | |
|---|---|---|---|---|---|---|---|---|---|---|---|---|---|---|---|---|
| | Cell 601 | | | | Cell 602 | | | | Cell 603 | | | | Cell 604 | | | |
| | P1 | S1 | W1 | D1 | P2 | S2 | W1 | D2 | P2 | S2 | W2 | D2 | P1 | S1 | W2 | D1 |
| Program Cell 601 | 0 | 26 | 36 | 26 | 26 | 26 | 36 | 26 | 26 | 26 | 0 | 26 | 0 | 26 | 0 | 26 |
| Erase Cell 601 | 0 | 0 | 36 | 0 | 26 | 26 | 36 | 26 | 26 | 26 | 0 | 26 | 0 | 0 | 0 | 0 |
| Read Cell 601 | 0 | 0 | 5 | 5 | 0 | 0 | 5 | 0 | 0 | 0 | 0 | 0 | 0 | 0 | 0 | 5 |

In the table, it is useful to elaborate on a few conditions. While programming or writing cell 601 the selected word select/erase gate line W1, which is selected by appication of a 5 volt potential thereto by operation of the decoder 20, is subsequently placed in a floating electrically isolated condition by operation of the coupling/decoupling array 32, and is provided with a voltage pulse of plus 36 volts through operation of the high voltage distribution and control circuitry 18. Source line S1 is placed at 26 volts to additionally bias the bias electrode 104 which thereby biases the floating gate positive through capacitor CS to promote electron flow to the floating gate of 601 from program line P1. The word select/erase line is biased +36 volts to further pull up the floating gate. Otherwise the capacitor CW would act as a load to prevent the floating gate from rising to a sufficient level to enable programming to occur. Since S1 is at 26 volts, drain line D1 may be 26 volts to stop undesired current flow. To avoid programming in cell 604, where W2 and P1 are 0 volts and S1 is +26 volts, the capacitive ratio between CW, CP and CS is selected such that the floating gate potential is not so large that it causes tunneling of electrons from P1 to the floating gate. In order not to program adjacent cell 602, the program line P2 is simultaneously maintained at approximately +26 volts to prevent electrons from entering the floating gate of the unselected cell 602. Source line S2 is +26 volts, so that D2 must also be +26 volts for the same reason as mentioned above for biasing D1 high when S1 is high. The line P2 is chosen to be +26 volts for convenience, and could be another voltage determined to optimized cell operation.

Similarly, cell 601 may be erased without disturb problems in adjacent cells 602, 603 or 604. In this case the word select/erase gate W1 is placed at +36 volts by appropriate operation of the decoder 20, coupling-/decoupling bank 32 and high voltage driver 18, and all other electrodes except P2, S2 and D2 are placed at 0 volts. Line P2 is biased at +26 volts to prevent disturbing cell 602 by keeping the potential between P2 and W1 small such that no tunneling occurs. In cell 603, since P2 is high (approximately +26 volts) and S2 is high (approximately +26 volts) then the floating gate is biased negative to P2.

In operation, the illustrated high voltage distribution and control circuit of FIG. 2 utilizes dynamic charging and discharging of capacitive systems. The charge condition of the isolated word line Xn is preset through the use of the coupling/decoupling transistor 501, and this charge condition subsequently governs the response of the distribution and control circuit 301 connected to the word line. In this manner, the high voltage, low power circuit 301 is rendered compatible with the row decoder 201.

The row decoder 201 is a high power, low impedence, high speed circuit because of its function of rapid decoding in the process of reading the memory, which typically may be carried out in the range of 1 to 100 nanoseconds. On the other hand, the distribution and control circuit 300 typically performs its function over a period of several milliseconds, which is substantially slower than the decoding and read function for the memory. By utilzing dynamic capacitative control coupling, and by placing the decoder circuitry on one end of the respective word or row lines, and the distribution and control circuitry on the other end of the row lines to physically separate them, the potential incompatability of these circuits is alleviated, and the addressing and decoding function of the conventional read circuitry 201 is utilized in the addressing and distribution of the high voltage signal HV generated by generator 30 upon initiation of the programming mode of the device 10.

As indicated, an isolation transistor T1 is provided for connecting and disconnecting the row decoder 201 from the row line Xn during the high voltage operation. During the low voltage, fast reading operation of the device 10, this coupling/decoupling transistor is "on", connecting the row decoder 201 to the row line Xn. During that time when they are connected, the row decoder having the low impedance capability completely overrides the function of the high voltage distribution circuit.

The isolation transistors T1 of the coupling/decoupling array may be turned off by a logical command by changing the control potential Vc applied thereto in an appropriate manner. When it is desired to change from the reading mode of the device 10 to the programming mode, the isolation transistor bank 32 (FIG. 1) is turned "off", and a command is then directed by appropriate means to the generator 30 to proceed to generate high voltage signals HV and HVC to raise the selected row line to high voltage. The high voltage distribution control circuit of FIG. 2 is adapted to raise its individual row line, when selected, to a high voltage, and a control mechanism is provided so that a selected row line may go high and, selected others are kept low. It is a particularly desirable feature of the illustrated embodiment that the high voltage decoding function may be provided by the row decoder, which avoids providing another decoder circuit for the high voltage distribution to the word lines.

In operation of the illustrated decoder 20, one selected row line addressed by the decoder 20 will go high to 5 volts, the other row lines are necessarily held low (e.g. 0-1 volts). Upon application of a decoupling control potential Vc to the coupling/decoupling transistor bank 32, this row line is left electrically isolated, or "floating" at the 5 volt potential, and presents a steady state (measured at constant voltage) impedance at ambient temperature of at least about one billion ohms to the high voltage circuit 301. In this regard, the isolated word line should best be capable of holding at least 80 percent of its 5 volt logic level charge for at least about 0.01 second and preferably at least 0.5 second at ambient temperature upon isolation by transistor T1. When high voltage signals HV and HVC are generated and applied to the high voltage driver bank 18, the high voltage circuit 301 is adapted to recognize the 5 volt potential on the isolated row line Xn as a command to transmit the high voltage HV to the row line, which has been electrically isolated by the respective coupling/decoupling transistor 201. A low potential on the row line is recognized by the distribution and control circuit 301 as a control signal to prevent transmission of HV to the row line Xn.

During the normal read function, the high voltage circuits will be randomly presented with 5 volt and 0 volt potentials, but high voltage is not transmitted to the distribution and control circuit bank 18 during a read operation. Additionally, during read operation of the device 10, high voltage signals HV and HVC are not activated except for an approximate 4 volt bias on HV line 426 to prevent current flow from any word or row line through any transistor T3 to the HV signal line 426 which would unnecessarily "load" the row line during the high speed read operation. To prepare for the high voltage operation, a row line is selected as if it were in the read mode. It then stays high longer than the normal read cycle time of, for example, about 250 nanoseconds, by virtue of the disconnection of the row line from the decoder circuit by means of the coupling/decoupling transistor 501. In this regard, the decoupling transistor T1 should provide an impedance of at least 100 million, and preferably at least a billion ohms when turned "off", and the total steady state impedance presented, at constant potential, by each of the row lines X through X+N upon being placed in "floating" condition by operation of decoupling transistor T1 to the respective circuits of the high voltage bank 18 should best exceed 10 million ohms, and more preferably exceed one billion ohms at ambient temperature. The isolated row line will accordingly hold its charge for a relatively long time, such that the row line may be utilized as a memory bit e.g., a charged capacitor, to hold the 5 volt charge for the distribution circuits 18. After a decoupling potential Vc is applied to the isolation transistor 32, the high voltage HV is applied to the bank of distribution circuits 18, which take the selected high word line higher, while the low word lines are kept low by means of the row decoder, as previously described. The illustrated isolation transistor 501 does not completely cut off the connection with the row decoder at low decoder voltage, but rather goes to an intermediate conduction level, in such a way that if the row decoder 201 is low, the isolation transistor still has sufficient transmission capability between the row decoder and the row line Xn to allow the decoder to hold the row low, which condition is recognized by the distribution and control circuit 18 as a signal to prevent transmission of any high voltage thereto. However, if the row decoder 201 potential VD is above this intermediate threshold level such as by being at 5 volts, it is cut off from the row Xn, so that the row is effectively free or "floating" in potential.

Turning now to FIG. 8, the operation of the circuit of FIG. 2 will be described in terms of the timing and potential diagrams there shown. As indicated, there are two basic modes of operation of the illustrated memory system 10, a read mode during which the memory may be addressed and decoded by the row decoder 20 and column decoder circuitry 14 and 16 in a substantially conventional manner, and a high voltage mode for programming the memory element, each of which has two states. In the read mode, as shown in FIG. 8a and 8b for unselected and selected rows, respectively, high voltage is not generated by the generator 30 or supplied to the HV or HVC input nodes of the distribution and control circuit, and the coupling/decoupling transistor bank 32 is kept in an "on" conducting state by application of appropriate control potential Vc to the Vc input nodes. In the read mode, decoded information is transmitted through the decoder 20 in a conventional manner to respective nodes VD of decoder segments 200 through 200+N, which transmit through respective coupling/decoupling transistors 500-500+N. During read operation, coupling/decoupling transistor control voltage Vc is held at 5 volts so that respective transistors T1 are maintained in a conducting state. During read operation of the array memory 10, the respective potentials VD applied from the decoder circuits 200 through 200+N, through the respective coupling/decoupling transistors will change with addressing change from about 5 volts to about zero volts, which potential is transmitted directly to the respective row line. The respective high voltage control circuit (e.g., circuit 301 of FIG. 2) experiences the row potential on the source of transistor T3 and source of transistor T2, without effecting any action in the circuit in the read mode because high voltage is not applied to the distribution and control circuit 18 during the read mode. If the row line is at a nominal logic level potential of 5 volts, the potential is directed to the drain of transistor T2 (FIG. 2) and is transmitted through transistor T2 to its source node, which node is the gate of T3. In this manner, a relatively high logic potential of approximately 4 volts is transmitted to the gate of transistor T3 when the selected row line is at a 5 volt potential. With the row line at 5 volts and the gate of transistor T3 at 4 volts, the circuit would tend to pull the source of transistor T3 (which is the high voltage line) to about 3 volts. However, because there is no current path through transistor T3, in the absence of application of high voltage to the high voltage distribution circuit bank 18, it will be appreciated that during read operation, the decoder 20 and the row lines are free to move between zero and 5 volts without interference from the high voltage circuit 18. To further remove the possible interference from the HV node to the row line, the HV node is maintained at a minimum bias of about 4 volts, as previously discussed, by appropriate conventional circuitry when the high voltage generator 30 is not activated.

This operation is shown in FIGS. 8a and 8b in which the read mode with a low level decoder potential and a high level decoder potential are transmitted to the row line in a conventional manner without interference in that operation from the high voltage distribution circuit 18. In the read mode, the word line potential Vw responds to the decoder potential VD, and only VD.

In the high voltage mode of operation as illustrated in FIG. 8, the decoder 201 is utilized in the normal manner to perform the decode function, and this drives the row line to either zero or 5 volts in accordance with normal addressing function of the decoder. As shown in FIG. 8, when the zero decoder level is transmitted from the decoder 201, the zero level is applied to the respective row line Xn. The control voltage Vc of the coupling/decoupling bank 500 through 500+N is then dropped (e.g., 0–2 volts) to achieve decoupling of the selected one or more high potential word or row lines, while maintaining these non-selected row lines at zero potential. In this regard, with decoder node VD of the unselected word or row line(s) at about zero volts potential, the control potential Vc of from about zero to two volts, is applied to the transistors T1 of the coupling/decoupling bank 32. Because transistor T1 is a depletion type transistor, it is still "on", and will transmit actively the zero potential applied by the decoder 201 to the row lines, so the row lines to which zero potential has been applied by the decoder array 201 are not fully isolated, or "floating", but rather are held at zero volts by connection to the decoder as an additional reliability factor. Moreover, because the word line is held at zero volts, the source of transistor T3 and also the source of transistor T2 of the high voltage distribution and control circuits (FIG. 2), which are connected to the respective row lines are also held near zero volts potential. The transistor T2 is in a conducting condition because its source is near zero, and its gate is at 5 volts. The drain of transistor T2 is coupled to the source voltage so that the gate of transistor T3 is about zero volts. With these operating parameters, when the high voltages HV and HVC are applied to the distribution and control circuit 18, the HVC node rises and attempts to charge the gate of transistor T3 through the capacitor C, but cannot charge the gate of transistor T3 because transistor T2 is on. Therefore transistor T3 is rendered nonconductive and prevents transmission of any voltage or current to the word line Xn.

The provision of an enhancement mode transistor T3 is important in the illustrated embodiment in the prevention of substantially all current flow to the unselected word lines which are at zero volts potential. Transistors T2, as illustrated, are enhancement transistors, but could be realized utilizing depletion transistors with appropriate bias voltage to reflect the various threshold changes. The circuit bank circuits themselves consume substantially no current, other than pn junction leakage, which is very small.

In the fourth mode of operation when the row line is raised to about 5 volts by selecting it in the normal operation of the decoder, node VD is raised to 5 volts, which potential is transmitted through the respective coupling/decoupling transistor T1 of the bank 32, which is in its normal "on" condition during decode operation. When it is desired to program memory cells of the selected row line, the control voltage Vc of coupling/decoupling transistor 501 (FIG. 2) is then subsequently reduced to between 2 volts and zero volts which has the effect of turning off depletion transistor T1, because of the relatively higher potential of the source and drain regions of the transistor T1. Accordingly, the row line is charged to around 5 volts and is substantially fully isolated or "floating". The row line has also charged through transistor T2 of the distribution and control circuit 18 and has charged the gate of transistor T3 to about 4 volts. At this point (time t1 of FIG. 8), the high voltage potentials HV and HVC are applied to the bank of distribution and control circuits 18 by an appropriate control signal to the generator 30. Because transistor T2 is substantially nonconductive, the capacitor Cc will couple the control potential HVC to the transistor T3 gate. Accordingly, the high voltage signal HV from the high voltage generator will be transmitted to the row line, and transistor T2 remains nonconductive during the charging of the selected row line.

The relatively high potential (e.g., 4 volts) applied to the gate of transistor T3 is sufficiently high to compensate for the high threshold drop resulting from the drain and source of transistor T3 being at a relatively high voltage (e.g., 15–40 volts). Because Capacitor C couples only a portion (e.g., 80–90%) of the voltage HVC applied to the gate of transistor T3, depending on its gate parasitic capacitance, the control signal HVC should be raised correspondingly 10–20% higher than HV in the illustrated embodiment to facilitate transmission of HV from the drain to the source of transistor T3, as previously indicated. Although the illustrated memory embodiment 10 preferably contemplates that only one of the word lines is selected by the decoder, it will be appreciated that it may be desirable to provide decoder circuitry which will select more than one of a large number of memory word lines or other circuit node elements, and such decoders may readily be provided.

The high voltage range of the circuit may be raised by appropriate modification of the gated diode breakdown of the various transistors. The illustrated embodiment utilizes n-channel MOS silicon technology, but it will be appreciated that systems in accordance with the present invention may be provided with other materials and fabrication techniques such as p-channel technology, with appropriate modification of components and voltage parameters. It should also be appreciated that although generally only positive voltage potentials are described herein, high negative voltage potentials may also be developed and controlled according to the present invention.

While various aspects of the present invention have been described with particular reference to a specific embodiment and utilization, it will be appreciated that various further uses, modifications and adaptations will become apparent based on the present disclosure, and are intended to be within the spirit and scope of the present invention.

In this connection, it will be appreciated that devices and methods in accordance with the present invention, and arrays of such devices, are compatible with various integrated circuit technologies such as CMOS (including CMOS/SOS) and bipolar integrated circuit design, and may be used in integrated circuits incorporating CMOS and bipolar integrated circuit elements.

Various of the features of the present invention are set forth in the following claims.

What is claimed is:

1. An integrated circuit for selectively applying high voltage to circuit elements utilizing such potentials comprising decoding means for charging one or more selected circuit elements nodes of a plurality of nodes to a first electrical potential and for charging other nodes of the plurality of nodes to a second potential, coupling-/decoupling means for electrically isolating at least the selected one or more circuit element nodes which have been charged to the first potential, and selective high voltage charging means responsive to the potential on each said selected circuit element node for charging said electrically isolated circuit element nodes at said first potential to an electrical potential greater than the first potential, while preventing the charging of other nodes to such greater potential.

2. An integrated circuit in accordance with claim 1 wherein said greater potential is in the range of from about 10 volts to about 50 volts and wherein said charging means comprises an integrated circuit, on-chip high voltage generator having current output capacity in the range of from about 0.1 to about 100 microamperes.

3. An integrated circuit in accordance with claim 1 wherein said integrated circuit is an electrically alterable nonvolatile memory system, and wherein said circuit element nodes are word or row lines of a memory array of the memory system.

4. An integrated circuit in accordance with claim 3 wherein said coupling/decoupling means comprises at least one transistor for each node, each said transistor operating to generate an impedance of less than about 8000 ohms in a coupling state and more than about 100 million ohms in a decoupling state, wherein said word or roll line nodes have a capacitance in the range of from about 1 picofarad to about 10 picofarads, and wherein said selective high voltage charging means comprises at least one transistor for controlling the application of high voltage from said high voltage generator to each of said nodes, at least one transistor for regulating the condition of each of said control transistors as a function of the potential of its respective node.

5. An integrated high voltage distribution and control circuit for selectively applying a high potential to a circuit element of an integrated circuit, comprising integrated circuit generator means for providing a high voltage signal having a maximum potential of at least about 10 volts, means for sensing the potential of said circuit element, means responsive to the sensed potential of said sensing means for applying a high potential of at least about 10 volts to the circuit element when the sensed potential of the element is above a predetermined value, and means responsive to the sensed potential of said sensing means for electrically isolating each said circuit element from said high potential when the sensed potential of the element is below a predetermined value.

6. An integrated high voltage distribution and control circuit for selectively applying a high potential to a circuit element of an integrated circuit, comprising integrated circuit generator means for providing a high voltage signal having a maximum potential of at least about 10 volts, means for sensing the potential of said circuit element and means responsive to the sensed potential of said sensing means for applying a high potential of at least about 10 volts to the circuit element when the sensed potential of the element is above a predetermined value, and preventing the application of a high potential to the circuit element when the senses potential of the element is below a predetermined value, wherein said circuit element is a word line of an integrated circuit nonvolatile memory array comprising means for electrically isolating the word line in a substantially electrically floating condition, and wherein said means responsive to the sense potential of the word line comprises means for transmitting high voltage between the generator means and the word line when the sense potential is above a predetermined value, and for substantially completely preventing transmission of high voltage between said generator means and said word line when the sensed potential of the output node is below a predetermined value.

7. A distribution and control circuit in accordance with claim 6 wherein said means for sensing the potential of the word line comprises at least one transistor capacitively coupled to a high voltage reference potential source, wherein said means for applying said high potential signal comprises at least one MOS enhancement type transistor connecting said generator means and said word line, said at least one enhancement transistor being regulated in its conduction by said at least one capacitively coupled transistor, and wherein said sensing means and said means for applying said high potential signal consumes less than about 10 nanoamperes in operation at ambient temperature.

8. A device in accordance with claim 7 wherein said predetermined potential value is intermediate to two logic level potentials in a memory array such that only one of the logic level potentials causes application of high voltage to the row line.

9. In an integrated circuit nonvolatile memory device comprising an array of nonvolatile addressable memory elements connected to row and column address lines, row decoder circuitry for applying a predetermined logic level potential to a selected row line of the memory array and column circuitry for I/O addressing of the column address line, the improvement comprising coupling/decoupling means for subsequently electrically isolating row lines at said predetermined potential from the row decoder circuitry, and low power consumption means for charging the selected, isolated row line at said predetermined potential to a higher potential while preventing charging of unselected row lines to such higher potential.

10. An integrated circuit nonvolatile memory device in accordance with claim 9 wherein said coupling/decoupling means and said charging means make electrical connection to said row lines at opposite ends thereof.

11. A method for selectively applying high potential to components of an integrated circuit nonvolatile memory array or the like, comprising the steps of addressing and charging one or more selected output nodes of a plurality of addressable nodes to a predetermined first control potential and charging other nodes to a predetermined second potential, electrically isolating at least the selected one or more output nodes at said first control potential, sensing the potential on each said selected output node, and charging the selected one or more electrically isolated nodes at the first control potential to a high potential in response to the sensed potential on each said selected output node while substantially completing preventing application of the high potential to said other nodes at the predetermined second potential.

12. A method in accordance with claim 11 wherein said output nodes are row lines of a nonvolatile memory array.

* * * * *

UNITED STATES PATENT AND TRADEMARK OFFICE
CERTIFICATE OF CORRECTION

PATENT NO. : 4,520,461
DATED : May 28, 1985
INVENTOR(S) : Richard T. Simko

It is certified that error appears in the above-identified patent and that said Letters Patent is hereby corrected as shown below:

Column 1, line 6, after "Feb. 2, 1981," insert --now U.S. Patent No. 4,486,769, issued December 4, 1984,--.

Column 1, lines 66-67, delete "patent application Ser. No. 71,498, filed Aug. 31, 1979" and insert --Patent No. 4,326,134, issued April 20, 1982, this latter invention--.

Column 2, line 44, ""pitch'" should be --"pitch"--.

Column 5, lines 30-31, delete "patent application Ser. No. 230,683" and insert --U.S. Patent 4,486,769--.

Column 6, lines 40-41, delete "patent application Ser. No. 71,498 filed Aug. 31, 1979" and insert --Patent No. 4,326,134--.

Column 7, line 5, delete "32" and substitute therefor --500-500+N--.

UNITED STATES PATENT AND TRADEMARK OFFICE
CERTIFICATE OF CORRECTION

PATENT NO. : 4,520,461

DATED : May 28, 1985

INVENTOR(S) : Richard T. Simko

It is certified that error appears in the above-identified patent and that said Letters Patent is hereby corrected as shown below:

Column 7, line 23, delete "22" and substitute therefor --32--.

Column 7, line 66, "Vd" should be --VD--.

Column 8, line 5, after "25" insert symbol --°-- to indicate degrees.

Column 8, line 5, "Vd" should be --VD--.

Column 5, line 15, after "line" insert --22--.

Column 8, line 17, delete "of the circuit 22".

Column 8, line 36, after "5" insert --volts--.

Column 8, lines 52-57, delete "The function of capacitor C .... row line Xn" and substitute therefor --Further details of the operation of control and distribution circuit 301 are given hereinbelow--.

Column 8, lines 67-68, "transistor" should be --transistors--.

UNITED STATES PATENT AND TRADEMARK OFFICE
CERTIFICATE OF CORRECTION

PATENT NO. : 4,520,461

DATED : May 28, 1985

INVENTOR(S) : Richard T. Simko

It is certified that error appears in the above-identified patent and that said Letters Patent is hereby corrected as shown below:

Column 9, line 16, "descibed" should be --described--.

Column 9, line 25, "illustraged" should be --illustrated--.

Column 9, line 53, "501" should be --301--.

Column 9, line 67, "and" should be --an--.

Column 10, line 10, "FIG. 1" should be --FIG. 5--.

Column 10, line 26, "souce" should be --source--.

Column 10, line 60, "have" should be --has--.

Column 11, line 44, "mercury" should be --memory--.

Column 12, lines 24-25, delete "parent application Ser. No. 230,683, and substitute therefor --U.S. Patent No. 4,486,769--.

Column 13, line 1, "appication" should be --application--.

Column 13, line 58, delete "300" and substitute therefor --301--.

UNITED STATES PATENT AND TRADEMARK OFFICE
CERTIFICATE OF CORRECTION

PATENT NO. : 4,520,461
DATED : May 28, 1985
INVENTOR(S) : Richard T. Simko

It is certified that error appears in the above-identified patent and that said Letters Patent is hereby corrected as shown below:

Column 14, line 26, "selected" should be --nonselected--.

Column 14, line 29, after "avoids" insert --the need for--.

Column 14, line 52, "201" should be --501--.

Column 14, lines 63-64, delete "426" and substitute therefor --26--.

Column 15, line 18, "transistor" should be --transistors--.

Column 17, line 33, delete "8" and substitute therefor --8D--.

Column 17, line 47, "C" should be --Cc--.

Column 19, line 22, "senses" should be --sensed--.

Column 20, line 40, delete "completing".

Signed and Sealed this

Seventeenth Day of December 1985

[SEAL]

Attest:

DONALD J. QUIGG

Attesting Officer

Commissioner of Patents and Trademarks